United States Patent [19]

Meyer

[11] Patent Number: 4,992,925
[45] Date of Patent: Feb. 12, 1991

[54] CONVERTER WITH INTERMEDIATE D.C. CIRCUIT

[75] Inventor: Helmut Meyer, Dossenheim, Fed. Rep. of Germany

[73] Assignee: Heidelberger Druckmaschinen AG, Heidelberg, Fed. Rep. of Germany

[21] Appl. No.: 302,834

[22] Filed: Jan. 27, 1989

[30] Foreign Application Priority Data

Jan. 29, 1988 [DE] Fed. Rep. of Germany ....... 3802593

[51] Int. Cl.⁵ .......................... H02M 5/45; H05K 7/02
[52] U.S. Cl. ..................................... 363/141; 363/37; 361/381; 361/393; 361/401
[58] Field of Search ........................ 363/37, 141, 144; 361/331, 393, 407, 429, 386, 388, 401, 379, 381

[56] References Cited

U.S. PATENT DOCUMENTS

| | | | |
|---|---|---|---|
| 3,480,836 | 11/1969 | Aronstein | 361/401 X |
| 4,677,540 | 6/1987 | Fujioka | 363/144 |
| 4,772,999 | 9/1988 | Fiorina et al. | 363/141 |
| 4,908,734 | 3/1990 | Fujioka | 363/141 |

FOREIGN PATENT DOCUMENTS

| | | |
|---|---|---|
| 2805019 | 8/1979 | Fed. Rep. of Germany . |
| 3041656 | 5/1982 | Fed. Rep. of Germany . |
| 8430060 | 3/1985 | Fed. Rep. of Germany . |
| 3416348 | 11/1985 | Fed. Rep. of Germany . |
| 3541273 | 5/1987 | Fed. Rep. of Germany . |
| 418449 | 2/1967 | Switzerland . |
| 569381 | 11/1975 | Switzerland . |

Primary Examiner—Steven L. Stephan
Assistant Examiner—Emanuel Todd Voeltz
Attorney, Agent, or Firm—Herbert L. Lerner; Laurence A. Greenberg

[57] ABSTRACT

A converter with an intermediate d.c. circuit includes power components grouped together in a plurality of modules. Bus bars are provided to which the modules are connected.

14 Claims, 4 Drawing Sheets

CONVERTER WITH INTERMEDIATE D.C. CIRCUIT

The invention relates to a converter having an intermediate d.c. circuit. For controllable drives with a.c or 3-phase motors, use is frequently made of converters in which the mains voltage is produced from the thus produced d.c. voltage, the a.c. voltage being controllable with regard to frequency and waveform Such converters contain several power components, such as rectifiers, transistors and/or thyristors and control circuits.

Conventional converters are provided with heat sinks which, on the one hand, are connected in a heat-conducting manner to the power components to be cooled and, on the other hand, are in the form of housing parts bearing further subassemblies, such as printed-circuit boards with control circuits, especially With these conventional converters, however, when repair is necessary, replacement or exchange of individual components is a complicated operation.

It is accordingly an object of the invention, to provide a converter in which maintenance and repair work can be easily performed.

With the foregoing and other objects in view, there is provided, in accordance with the invention, a converter with an intermediate d.c. circuit, comprising power components grouped together in a plurality of modules, and bus bars to which the modules are connected.

Repair work, in particular, is thus facilitated by a simple replacement of the modules. The converter according to the invention is suitable both for A.C. and 3-phase motors as well as for non-commutating d.c. motors.

In accordance with another feature of the invention, there is provided a mounting plate formed with cutouts, and wherein the modules project through the cutouts formed in the mounting plate in a manner that the modules are removable from a side of the mounting plate located opposite the bus bars. This further development of the invention contributes to a further simplification of the construction of the converter according to the invention.

In accordance with a further feature of the invention, a plurality of the modules on the side of the mounting plate located opposite the bus bars are formed as heat sinks and are larger in at least one direction than the cutouts. In addition to the simple exchangeability of the modules, this feature of the invention permits particularly favorable cooling of the power components.

In accordance with an added feature of the invention, that are provided control circuits provided on a printed-circuit board, the printed-circuit board being disposed substantially parallel to the mounting plate on the side of the bus bars. This prevents unnecessary heating of the control circuits by the heat emitted by the heat sinks and, moreover, permits short connections between the control circuits and the corresponding power components.

To further facilitate maintenance and repair work, in accordance with an additional feature of the invention, the printed-circuit board is hinged and is connected by flexible lines to a plurality of the modules.

To prevent mistakes when new modules are inserted, in accordance with yet another feature of the invention, the modules are mechanically coded so as to be secure against exchange. Furthermore, the converter includes half-bridge switch modules electrically coded so that circuits driving the half-bridge switch modules are automatically matched to characteristics of the half-bridge switches. Such electrical coding may be formed, for example, of a resistor, the value of which is dependent on the coded information and can be interrogated by a control circuit.

In a converter according to the invention, at least the following modules should preferably be provided: a rectifier module, a capacitor module and a half-bridge switch module Further modules may be provided, if required. Mechanical coding of the capacitor modules, in addition to preventing mixing-up with other modules, may also prevent polarity reversal of the capacitors The half-bridge switch modules are preferably mechanically coded in such a manner that they are interchangeable with one another but not with other modules The capacitors may accordingly be formed with holes of different dimensions or may have mountings formed with threads having different pitches thereby avoiding accidental interchange of the modules.

Furthermore, the capacitor modules may each include a monitoring device which is responsive in the event of a defect. For this purpose, it is possible, for example, for the ripple of the voltage applied to the capacitor to be measured and for it to be compared with a specified value. The capacitors may also be provided with a pin which is pushed out by excess pressure in the interior of the capacitor. A fault or failure signal can thus be produced by a suitable sensor.

If a capacitor develops a low resistivity due to the defect, it can be immediately disconnected from the rest of the circuit by the monitoring device. If several capacitor modules are connected in parallel, it is possible for the operation to be maintained after disconnection and when a defect causes a high resistivity, respectively. This requires, however, that the capacitors have suitably sufficient dimensions.

In accordance with again another feature of the invention the modules include that at least a rectifier module, a capacitor module and a half-bridge switch module.

In accordance with again a further feature of the invention, there is provided another half-bridge switch module.

In accordance with again an added feature of the invention, there is provided a braking chopper module.

In accordance with again an additional feature of the invention, there is provided a current and voltage-measuring module disposed between the capacitor module and the half-bridge switch module.

In accordance with still another feature of the invention, there are provided means for protecting the capacitor module against polarity reversal.

In accordance with still a further feature of the invention, the printed-circuit board with a driver circuit is provided on each of the half-bridge switch modules.

In accordance with still an added feature of the invention, the printed-circuit board with a driver chopper is also provided on the braking chopper module.

In accordance with a concomitant feature of the invention, each of the capacitor modules has a monitoring apparatus.

Other features which are considered as characteristic for the invention are set forth in the appended claims.

Although the invention is illustrated and described herein as embodied in a converter with intermediate d.c. circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 1 a top plan view of a first embodiment of the invention;

Like parts in the figures are identified by the same reference numerals.

Figure 1:
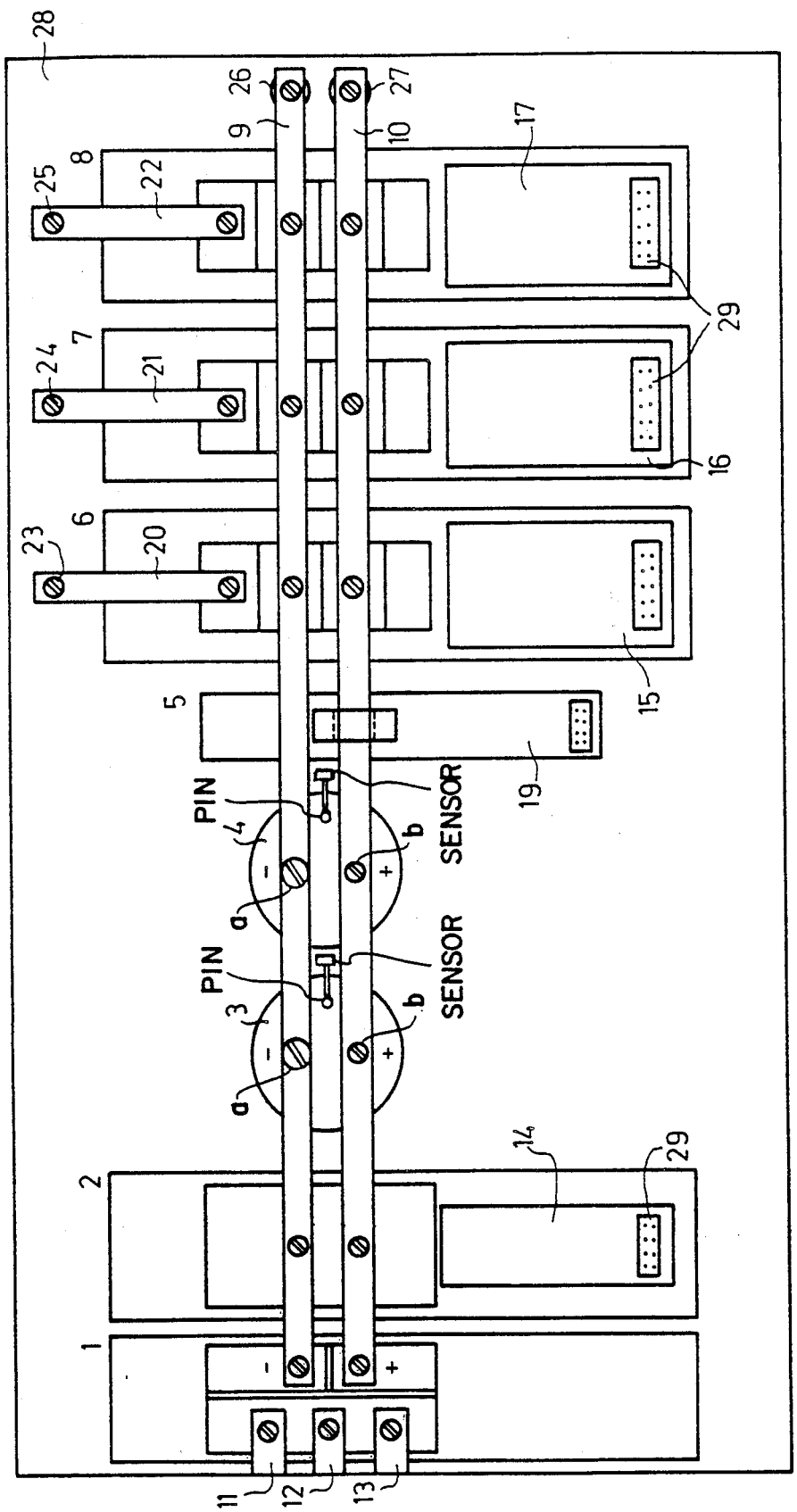
Figure 2:
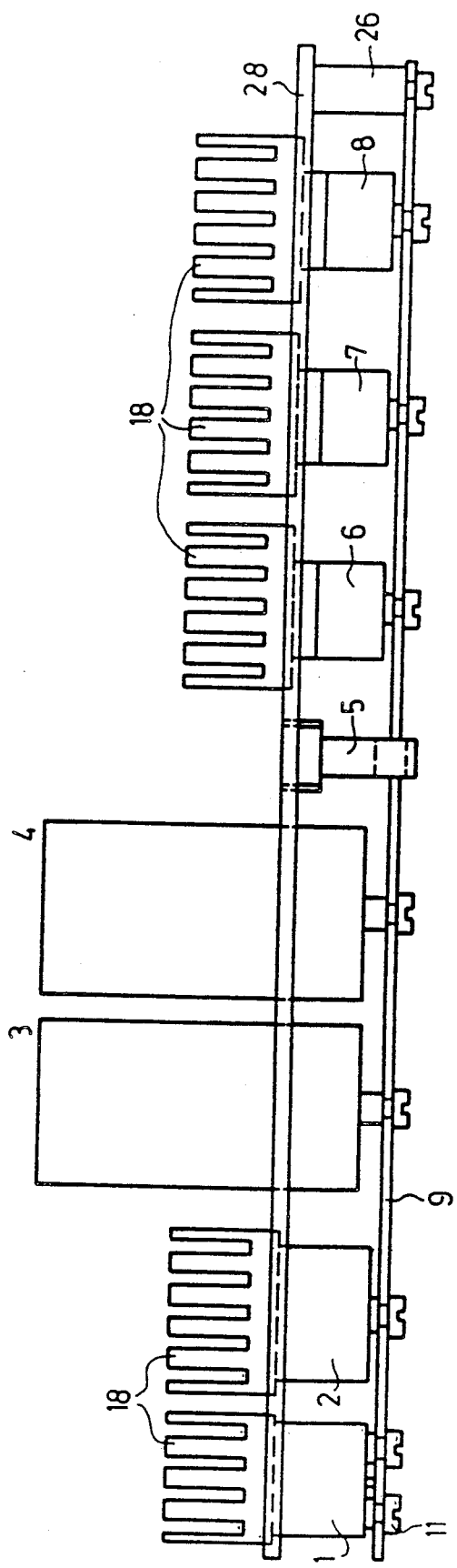
FIG. 2 is a side elevational view of FIG. 1.

Referring now more specifically to the drawing and particularly to FIGS. 1 and 2 thereof, there is shown therein an embodiment of the invention, which includes a rectifier module 1, a braking chopper module 2, two capacitors 3 and 4, a current and voltage-measuring module 5 and three half-bridge switch modules 6, 7 and 8. The modules are electrically connected to one another by two bus bars 9 and 10. The rectifier module 1 is supplied with 3-phase current via connections 11, 12 and 13. The half-bridge switch modules 6, 7 and 8 and the braking chopper module 2 are provided with a respective printed-circuit board 14, 15, 16, 17, which bears a driver circuit for the power components of the respective module. The power components themselves are disposed in the modules so as to have a good heat-conducting connection with respective heat sinks 18.

The printed-circuit boards 14 to 17 as well as a printed circuit board 19 of the current and voltage-measuring module 5 are provided with multipoint or multiway connectors 29, which afford a detachable electrical connection with control circuits. Output connections of the half-bridge switch modules are connected via additional bus bars 20, 21 and 22 to terminals 23, 24 and 25 at which three phases U, V and W of a converted 3-phase current can be drawn The bus bars 9 and 10 are supported by insulating columns 26 and 27.

The modules 1 to 4 and 6 to 8 project through corresponding cutouts formed in a mounting plate 28, the heat sinks 18 being provided on the side of the mounting plate 28 located opposite the bus bars 9 and 10. Thus, for example, the mounting plate 28 may constitute the back of a housing, with the bus bars 9 and 10, as well as non-illustrated control circuits being disposed inside the housing, while the heat sinks 18 are disposed outside the housing. This permits the heat loss to be passed directly from the heat sinks 18 to the ambient air without heating up the circuits inside the housing. Likewise, it is possible to dispose the mounting plate 28 in the form of a partition inside a housing, with the result that one part of the housing is provided for the control circuits, while the other part of the interior of the housing serves to circulate the air.

Figure 3:
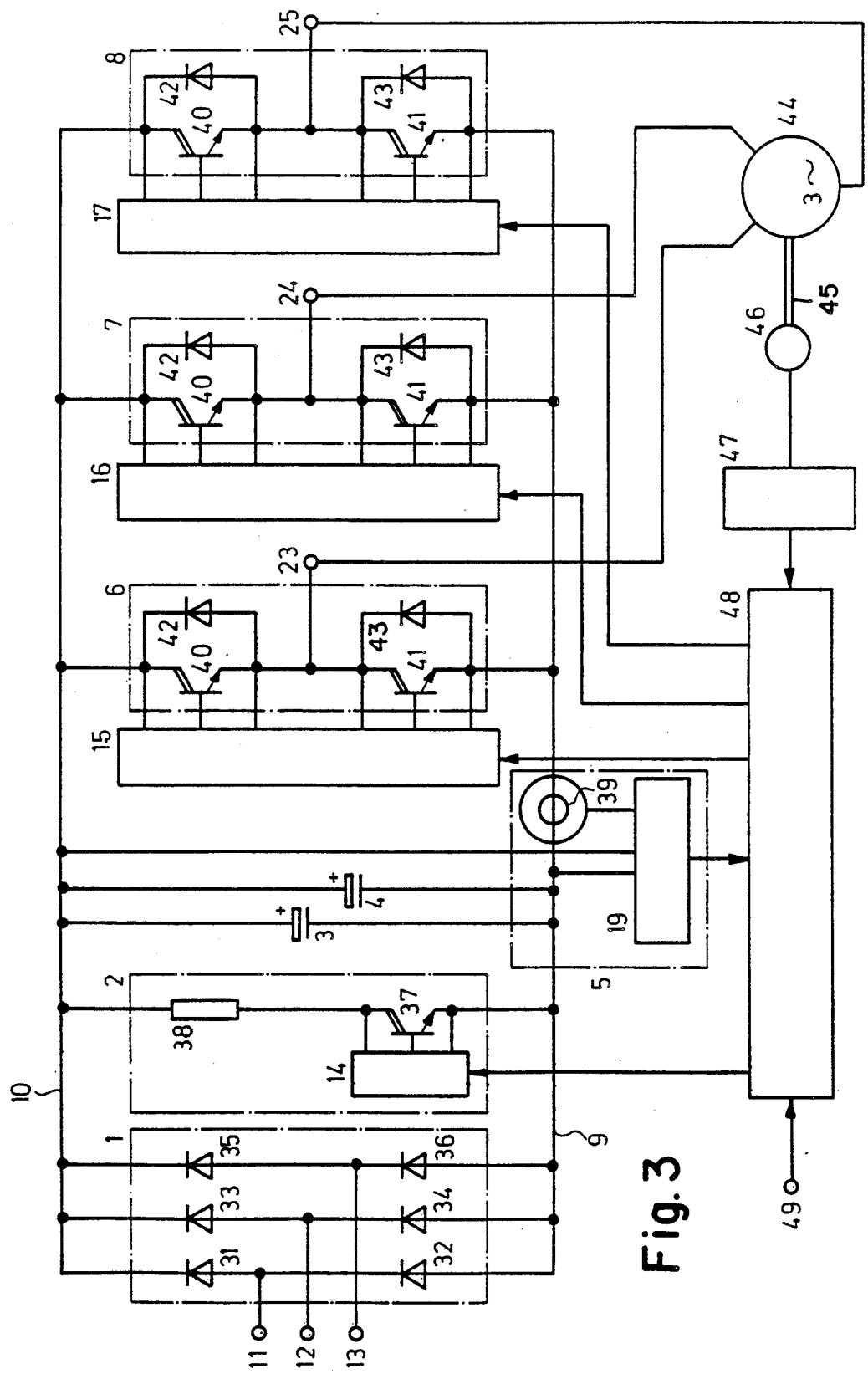
FIG. 3 is a circuit diagram of the circuit of the first embodiment of FIGS. 1 and 2.

FIG. 3 shows the circuit arrangement of the embodiment according to FIG. 1 and 2 and several further electrical subassemblies. The rectifier module 1 is formed in a conventional manner of six rectifier diodes 31 to 36. The braking chopper module 2 contains a switching transistor 37, which is connected in series with a load resistor 38 and is driven by a conventional driver circuit 14 (shown only diagrammatically). Such driver circuits are produced by the German Firm Maschinenfabrik Stahlkontor Weser Lenze GmbH & Co. of Hameln, Germany and are illustrated in at least one brochure published by that firm. The current and voltage-measuring module 5 contains a conventional circuit 19 and a current sensor 39 which operates in accordance with the Hall principle Such current sensors are manufactured the Microswitch Division of the Honeywell Corporation.

The half-bridge switch modules 6, 7 and 8 each contain two power transistors 40 and 41, which are by-passed by a diode 42, 43, respectively. Each half-bridge switch module 6, 7, 8 is assigned a respective conventional driver circuit 15, 16, 17. Outputs 23, 24 and 25 of the half-bridge switch modules are connected to a non-commutating d.c. motor 44, which serves to drive a machine, for example a printing press, at a controllable speed. Disposed on the motor shaft 45 is a conventional angle sensor 46, the output signals of which are supplied via a conditioning circuit 47 to a control circuit 48. Such control circuits are conventional and need not be described in any greater detail within the scope of the present invention. Reference may, however, be had to the aforementioned German firm for suitable examples of such control circuits.

Supplied via an input 49 is a signal that represents a setpoint input with regard to the speed or the direction of rotation of the motor 44. With account being taken of the output voltage of the angle sensor 46 and the output voltage of the current and voltage-measuring module 15, signals for driving the half-bridge switch modules 6, 7 and 8 and the braking chopper module 2 are produced in a conventional manner and are supplied to the driver circuits 14 to 17 of these modules.

Figure 4:
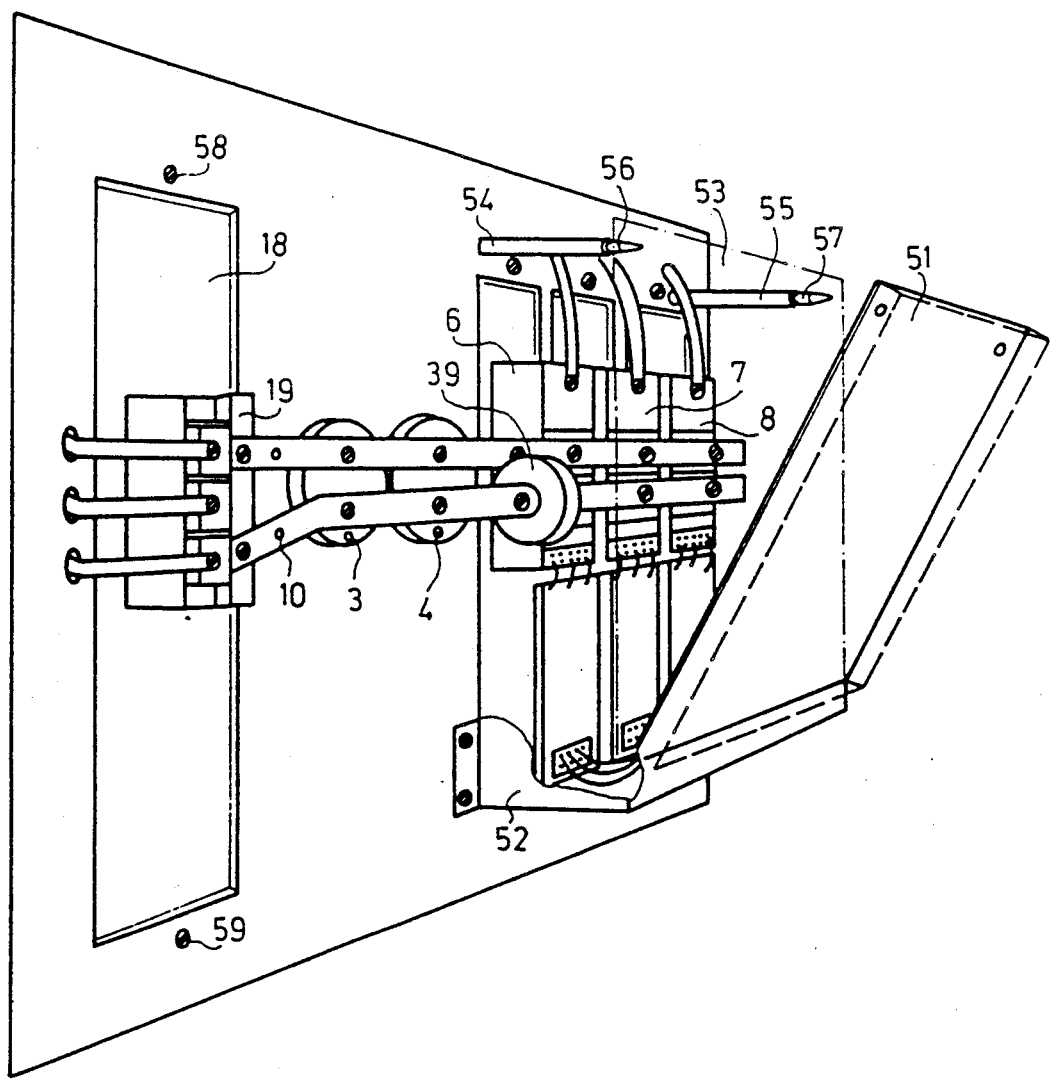
FIG. 4 is a perspective view of a second embodiment of the invention.

In a second embodiment of the invention shown in a perspective view in FIG. 4, the control circuit 48 is disposed on a printed-circuit board 51, which is hinged in a conventional manner on a mount 52. In the operating position 53, shown in phantom, the printed-circuit board 51 is further held by two spacer columns 54 and 55, at the ends of which threads 56 and 57 are provided which project through non-illustrated holes formed in the printed-circuit board 51, so that the printed-circuit board 51 can be secured by means of non-illustrated nuts. Also represented in FIG. 4 by broken lines is the space taken up by the components of the control circuit.

In the embodiment according to FIG. 4, the heat sinks 18 of the modules 1, 6, 7 and 8 are larger than the cutouts in the mounting plate, with the result that they can be held above and below the cutouts by a respective screw 58, 59.

As mentioned hereinbefore and as shown in FIG. 1, the capacitors 3 and 4 are provided with a respective pin which is pushed out by excess pressure in the interior of the capacitor. A fault or failure signal is then produced by the diagrammatically represented sensor.

Also, as mentioned hereinbefore and as shown in FIG. 1, the capacitors 3 and 4 are connected to the bus bars 9 and 10, respectively, by screws a and b having threads of different pitches which are engaged in non-illustrated threaded holes formed in the respective poles of the capacitors 3 and 4.

I claim:

1. Converter with an intermediate d.c. circuit, comprising power components grouped together in a plurality of modules having respective printed-circuit boards for control circuits disposed thereon, and bus bars to which said modules are connected, and a mounting plate formed with cutouts, said modules projecting through said cutouts formed in said mounting plate in a manner that said modules are removable from a side of said mounting plate located opposite said bus bars.

2. Converter according to claim 1, wherein a plurality of said modules on said side of said mounting plate located opposite said bus bars are formed with heat sinks and have at least one dimension which is greater than a corresponding dimension of said cutouts.

3. Converter according to claim 2, comprising control circuits provided on a printed-circuit board, said printed-circuit board being disposed substantially parallel to said mounting plate on said side of said bus bars.

4. Converter according to claim 3, wherein said printed-circuit board is hinged and is connected by flexible lines to a plurality of said modules.

5. Converter according to claim 1, wherein said modules are mechanically coded so as to be secure against exchange.

6. Converter according to claim 1, including half-bridge switch modules electrically coded so that circuits driving said half-bridge switch modules are automatically matched to characteristics of said half-bridge switches.

7. Converter according to claim 1, wherein said modules include a rectifier module, a capacitor module and a half-bridge switch module.

8. Converter according to claim 8, including another half-bridge switch module.

9. Converter according to claim 8, including a braking chopper module.

10. Converter according to claim 7, including a current and voltage-measuring module disposed between said capacitor module and said half-bridge switch module.

11. Converter according to claim 7, including means for protecting said capacitor module against polarity reversal.

12. Converter according to claim 8, wherein said printed-circuit board with a driver circuit is provided on each of said half-bridge switch modules.

13. Converter according to claim 12, wherein said printed-circuit board with a driver chopper is also provided on said braking chopper module.

14. Converter according to claim 7, wherein each of said capacitor modules has a monitoring apparatus.

* * * * *